United States Patent
Yamaji

(10) Patent No.: US 7,522,080 B2
(45) Date of Patent: *Apr. 21, 2009

(54) A/D CONVERTER, SIGNAL PROCESSOR, AND RECEIVING DEVICE

(75) Inventor: Takafumi Yamaji, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/055,850

(22) Filed: Mar. 26, 2008

(65) Prior Publication Data

US 2008/0180297 A1 Jul. 31, 2008

Related U.S. Application Data

(63) Continuation of application No. 11/613,607, filed on Dec. 20, 2006, now Pat. No. 7,372,385.

(30) Foreign Application Priority Data

Jun. 28, 2006 (JP) .............................. 2006-178566

(51) Int. Cl.
*H03M 3/00* (2006.01)

(52) U.S. Cl. ................. 341/143; 341/118; 341/120; 341/144; 341/155

(58) Field of Classification Search ................. 341/118, 341/120, 143, 155
See application file for complete search history.

(56) References Cited

U.S. PATENT DOCUMENTS

| | | | |
|---|---|---|---|
| 5,841,388 A | 11/1998 | Yasuda et al. | |
| 6,005,506 A * | 12/1999 | Bazarjani et al. | 341/143 |
| 6,320,529 B1 * | 11/2001 | Yasuda | 341/155 |
| 6,614,373 B1 * | 9/2003 | Frazier | 341/143 |
| 6,614,855 B1 * | 9/2003 | Okamoto | 375/316 |
| 6,635,859 B2 | 10/2003 | Wiles | |
| 6,670,901 B2 * | 12/2003 | Brueske et al. | 341/139 |
| 6,765,517 B1 * | 7/2004 | Ali | 341/143 |
| 6,864,817 B1 * | 3/2005 | Salvi et al. | 341/139 |
| 6,885,852 B2 | 4/2005 | Hughes et al. | |
| 7,242,334 B2 * | 7/2007 | Holden | 341/139 |
| 7,262,724 B2 * | 8/2007 | Hughes et al. | 341/139 |
| 7,268,715 B2 | 9/2007 | Guimaraes | |
| 7,295,813 B2 * | 11/2007 | Haub et al. | 455/67.13 |
| 7,372,385 B2 * | 5/2008 | Yamaji | 341/143 |
| 2002/0094792 A1 * | 7/2002 | Oono et al. | 455/118 |

OTHER PUBLICATIONS

Breems et al., A 1.8-mW CMOS Modulator with Integrated Mixer for A/D Conversion of IF Signals, IEEE Journal of Solid-State Circuits, vol. 35, No. 4, Apr. 2000, pp. 468-475.

(Continued)

*Primary Examiner*—Linh V Nguyen
(74) *Attorney, Agent, or Firm*—Amin, Turocy & Calvin, LLP

(57) ABSTRACT

An A/D converter which converts an analog current signal into a digital signal, includes: a filter removing a noise component from the analog current signal to output an analog voltage signal; a quantizer quantizing the analog voltage signal outputted from the filter to generate the digital signal; and a D/A converter converting the digital signal generated by the quantizer into an analog feedback current to feedback to an input of the filter, and supplying a bias current for the D/A converter to an output of a frequency converter via a path of the analog current signal as a bias current driving the frequency converter outputting the analog current signal.

12 Claims, 4 Drawing Sheets

OTHER PUBLICATIONS

Yasuda et al., A Third-Order Modulator Using Second-Order Noise-Shaping Dynamic Element Matching, IEEE Journal of Solid-State Circuits, vol. 33, No. 12, Dec. 1998, pp. 1879-1886.

Nys et al., A 19-Bit Low-Power Multibit Sigma-Delta ADC Based on Data Weighted Averaging, IEEE Journal of Solid-State Circuits, vol. 32, No. 7, Jul. 1997, pp. 933-942.

* cited by examiner

A/D CONVERTER, SIGNAL PROCESSOR, AND RECEIVING DEVICE

CROSS-REFERENCE TO RELATED APPLICATIONS

This application claims the benefit of priority from and is a continuation of application Ser. No. 11/613,607 filed on Dec. 20, 2006, which is based upon and claims the benefit of priority from prior Japanese Patent Application No. 2006-178566, filed on Jun. 28, 2006, the entire contents of both applications are incorporated herein by reference.

BACKGROUND OF THE INVENTION

1. Field of the Invention

The present invention relates to an analog circuit of, for example, a communication device and so on, and particularly relates to an analog-digital converter, a signal processor, and a receiving device.

2. Description of the Related Art

In a communication device including an analog-digital converter (hereinafter, called as an "A/D converter", "ADC"), it is necessary to adjust an input signal amplitude to be enough larger than a minimum resolution of the ADC and smaller than a maximum input signal amplitude of the ADC. As a method to adjust the input signal amplitude, for example, a method to use a variable gain amplification circuit can be cited, but in the variable gain amplification circuit, a problem is known in which a direct current offset varies. In particular, when a gain is controlled with following to a variation of received signal intensity in a radio communication in which the intensity varies, the direct current offset of an output may vary in accordance with the variation of the gain. Generally, the direct-current offset is removed by a feedback control and so on, but there is a problem that communication quality may deteriorate until a transient response converges. To avoid this problem, a method is studied in which an input dynamic range of the ADC is enlarged and a variable range of the variable gain amplification circuit is reduced, or the variable gain amplification circuit in itself is omitted.

Meanwhile, a study for a delta-sigma type analog-digital converter (DSADC) is in progress, in which a continuous time filter enabling an omission of an anti-alias filter required for the ADC is used (refer to L. J. Breems and others, "A 1.8 mW CMOS ΣΔ Modulator with Integrated Mixer for A/D Conversion of IF Signals", IEEE Journal of Solid-State Circuits, April, 2000, Vol. 35, No. 4, p. 468 to p. 475). In the document of L. J. Breems and others, an example is reported, in which a frequency conversion circuit down-converting an IF signal of 50 MHz and a DSADC operating with a clock of 13 MHz are connected directly.

However, when the frequency conversion circuit and the DSADC described in the above document are applied to a radio receiver such as a cellular phone, it is necessary to supply a high frequency signal with low impedance for the extent that it does not affect a circuit operation. Accordingly, a high-frequency buffer amplifier consuming a relatively large current is necessary. In addition, a DAC for feedback constituting the DSADC in itself is a switch, and therefore, a power consumption thereof is small. However, a direct-current voltage supply circuit having enough low output impedance is necessary so as not to generate a voltage variation by an ON/OFF operation of the switch of the DAC, to supply a reference voltage to the DAC. Namely, there has been a problem that an elimination of power consumption is difficult as a total because the power consumption with including peripheral circuits increases conversely in the frequency conversion circuit and the DSADC described in the above document.

BRIEF SUMMARY OF THE INVENTION

As stated above, in the conventional ADC, signal processor, and receiving device, there is a problem that a current consumption becomes large because peripheral circuits such as the high-frequency buffer amplification circuit and the direct-current voltage supply circuit supplying the reference voltage to the DAC become necessary when they are combined with a frequency converter. The present invention is made to solve the problem as stated above, and an object thereof is to provide an A/D converter, a signal processor, and a receiving device capable of eliminating power consumption with including peripheral circuits.

To attain the above-stated object, an A/D converter according to a first aspect of the present invention which converts an analog current signal into a digital signal includes: a filter removing a noise component from the analog current signal to output an analog voltage signal; a quantizer quantizing the analog voltage signal outputted from the filter to generate the digital signal; and a D/A converter converting the digital signal generated by the quantizer into an analog feedback current to feedback to an input of the filter, and supplying a bias current for the D/A converter to an output of a frequency converter via a path of the analog current signal as a bias current driving the frequency converter outputting the analog current signal.

A signal processor according to a second aspect of the present invention includes: a frequency converter frequency converting an analog input signal to output an analog current signal; a filter removing a noise component form the analog current signal to output an analog voltage signal; a quantizer quantizing the analog voltage signal outputted from the filter to generate a digital output signal; and a D/A converter converting the digital output signal generated by the quantizer into an analog feedback current to feedback to an input of the filter, and supplying a bias current for the D/A converter to an output of the frequency converter via a path of the analog current signal as a bias current driving the frequency converter. Incidentally, the D/A converter is a D/A converter converting the digital output signal generated by the quantizer into the analog feedback current to feedback to the input of the filter, and the frequency converter may be the one driven by reusing the bias current of the D/A converter.

A receiving device according to a third aspect of the present invention includes: an amplifier amplifying a received signal; a signal processor according to the second aspect; and a digital processor decrypting a digital output signal.

DETAILED DESCRIPTION OF THE INVENTION

Figure 1:
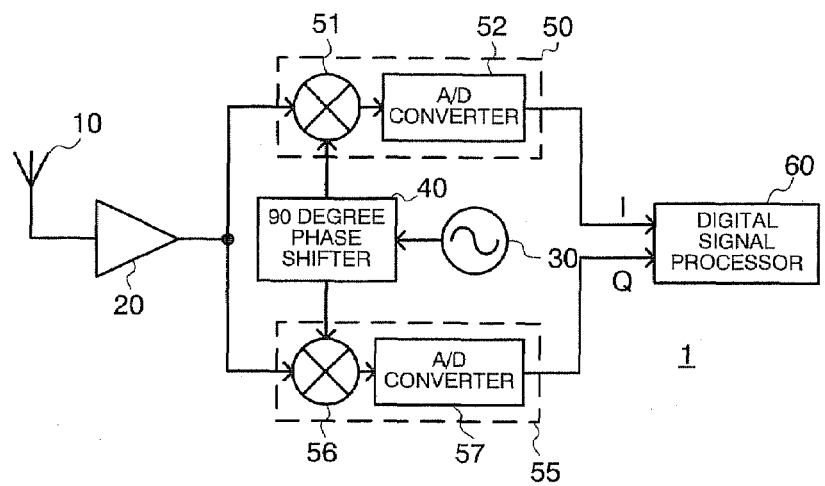
FIG. 1 is a block diagram showing a configuration of a receiving device of a first embodiment of the present invention.

Hereinafter, a first embodiment of the present invention is described in detail with reference to the drawings. As shown in FIG. 1, a receiving device 1 of this embodiment includes an antenna 10, an LNA 20, a local oscillator 30, a 90 degree phase shifter 40, analog signal processors 50, 55 having frequency converters 51, 56 and A/D converters 52, 57, and a digital signal processor 60. The receiving device 1 of this embodiment is configured to be a receiver demodulating a digital signal modulated by quadrature modulation with a direct conversion system.

The antenna 10 is an antenna receiving a radio wave which is to be demodulated by this receiving device 1. The LNA 20 is a Low Noise Amplifier for a high-frequency signal, which amplifies a received signal captured by the antenna 10. A high-frequency signal amplified by the LNA 20 is distributed and inputted to the analog signal processors 50 and 55.

The local oscillator 30 is a local oscillator to frequency-convert the received signal amplified by the LNA 20 into a base band signal. The local oscillator 30 may generate a local signal directly by an IC for high-frequency oscillation, a PLL, and so on, or may generate a local signal having an objective frequency while passing through plural stages by a multiplier, a mixer, and so on.

The 90 degree phase shifter 40 shifts a phase of the local signal. Specifically, the 90 degree phase shifter 40 distributes the local signal generated by the local oscillator 30 into two signals, and provides the distributed local signals to the analog signal processors 50 and 55 respectively while performing the phase shifting process of the distributed local signals so that a phase difference thereof is to be 90 degrees. The 90 degree phase shifter 40 is realized by, for example, a distributor distributing the local signal, and a phase shifter delaying or advancing the phase of one of the distributed local signal for 90 degrees, and so on. The two local signals shifted their phases for 90 degrees are respectively inputted to the analog signal processors 50 and 55.

The analog signal processor 50 includes the frequency converter 51 multiplying the received signal amplified by the LNA 20 and the local signal provided from the local oscillator 30 via the 90 degree phase shifter 40 and frequency-converting into a base band signal, and the A/D converter 52 converting the analog received signal converted to the base band signal, into a digital base band signal. Namely, the analog signal processor 50 has functions to frequency-convert the received signal and to convert into the digital signal. The analog signal processor 55 has a common configuration with the analog signal processor 50, and it has the frequency converter 56 and the A/D converter 57. The local signal having 90 degrees different phase from that of the analog signal processor 50 is provided to the analog signal processor 55. Consequently, quadrature demodulated base band signals "I" and "Q" are outputted from the analog signal processors 50 and 55, to be sent to the digital signal processor 60.

The digital signal processor 60 decrypts the digital base band signals "I", "Q" provided from the analog signal processors 50 and 55, and converts into original digital data. Processes in accordance with types of data are performed to the decrypted original digital data, such as to be further converted into audio signal by a not-shown D/A converter, to be further performed a data process by a not-shown information processor, or the like.

The received signal captured by the antenna 10 is inputted to the LNA 20. The LNA 20 amplifies the received signal up to a predetermined level to input to the frequency converters 51 and 56. Meanwhile, the local oscillator 30 generates the local signal required for converting the received signal into the base band signal. The 90 degree phase shifter 40 distributes the local signal, inputs one local signal to the frequency converter 51, and inputs the other local signal to the frequency converter 56 while delaying the phase thereof for 90 degrees. The frequency converters 51 and 56 respectively multiply the distributed received signals and the local signals, generate the analog base band signals, and send them to the A/D converters 52 and 57. The A/D converters 52 and 57 convert the analog base band signals into the digital base band signals to respectively input them to the digital signal processor 60. The digital signal processor 60 performs the decryption process of the inputted digital base band signals.

Figure 2:
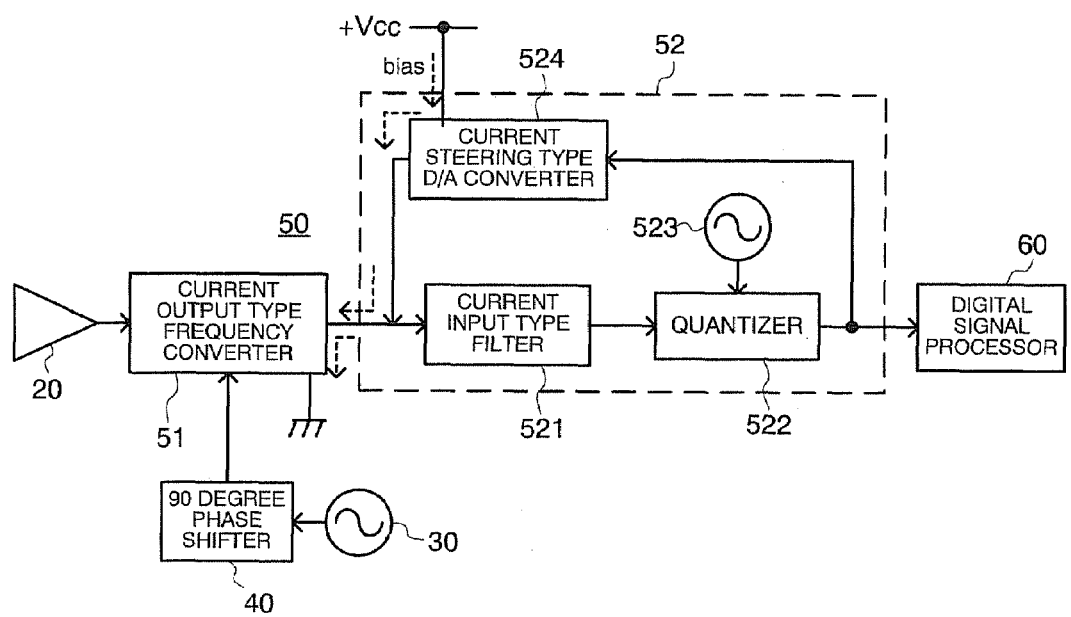
FIG. 2 is a block diagram showing a configuration of an analog signal processor according to the receiving device of the first embodiment.

Subsequently, an analog signal processor of this embodiment is described in detail with reference to FIG. 2. As shown in FIG. 2, the analog signal processor 50 of this embodiment has the frequency converter 51 in a current output type, and the A/D converter 52 comprising a current input type filter 521, a quantizer 522, a clock oscillator 523 and a D/A converter 524 in a current steering type. Incidentally, the analog signal processor 55 has a common configuration with the analog signal processor 50, and therefore, a description thereof will not be given.

The frequency converter 51 is a frequency converter of the current output type. The "current output type" means that a frequency converted signal is outputted as a current. The frequency converter 51 is composed of, for example, a frequency conversion circuit constituted by NMOS transistors, and it is constituted so that a bias current flows from an output terminal toward a negative power supply terminal (or a ground terminal). Namely, the bias current flows in, and the frequency-converted signal is outputted from the output terminal. An output signal of the frequency converter 51 is inputted to the current input type filter 521.

The A/D converter 52 comprises the current input type filter 521, the quantizer 522, and the current steering type D/A converter 524, and is configured to be so-called a delta-sigma modulator. The current input type filter 521 is so-called a continuous-time filter, and it has functions to remove a aliasing noise from the signal frequency-converted at the frequency converter 51, and to enhance a gain at an objective frequency so that a signal in a signal loop composing the A/D converter 52 is to be the objective frequency. The "current input type" means that an input signal is received by a current. The current input type filter 521 operates to convert a component having a relatively low frequency being an objective signal frequency band into a voltage with a high conversion efficiency, and to remove a component having a relatively high frequency being an unnecessary signal frequency band.

The quantizer 522 quantizes an analog signal which is performed a filtering by the current input type filter 521, based on a clock signal generated by the clock oscillator 523. The quantizer 522 converts the inputted analog signal into a digital signal of one bit to several bits. A digital output signal from the quantizer 522 is inputted to the digital signal processor 60 as an output signal of the A/D converter 52, and also, inputted to the current steering type D/A converter 524 as a digital feedback signal.

The current steering type D/A converter 524 converts the digital feedback signal from the quantizer 522 into an analog feedback current. The "current steering type" means that a digital signal is converted into an analog current output. The current steering type D/A converter 524 is composed of, for example, a D/A conversion circuit constituted by PMOS transistors, and a bias current flows out from a positive power supply terminal toward an output terminal. Namely, the bias current flows out, and the D/A converted feedback current is outputted from the output terminal. The D/A converted analog feedback current is inputted to a connection point of the frequency converter 51 and the current input type filter 521.

Here, a load resistance connected to a ground is omitted in the current steering type D/A converter 524, and the load resistance connected to a positive power supply is omitted in the frequency converter 51. Further, the output terminal of the current steering type D/A converter 524 and an output terminal of the current output type frequency converter 51 are directly connected with each other without being intervened by a capacitor and so on. Namely, the bias current of the current steering type D/A converter 524 flowing from a positive power supply "Vcc" into the current steering type D/A converter 524 flows out from a ground of the frequency converter 51 via the output of the current steering type D/A converter 524 and the output of the frequency converter 51.

Subsequently, operations of the analog signal processor 50 are described. The high-frequency signal amplified by the LNA 20 is inputted to the current output type frequency converter 51. The frequency converter 51 multiplies the high-frequency signal and the local signal generated at the local oscillator 30, and outputs a base band current signal.

On the other hand, the current steering type D/A converter 524 converts the digital feedback signal from the output of the quantizer 522 into the analog feedback current to output, and the respective output currents of the frequency converter 51 and the current steering type D/A converter 524 are not necessarily matched. A difference component of the output currents are inputted to the current input type filter 521.

An output voltage of the current input type filter 521 is inputted to the quantizer 522, to be converted into the digital signal of one bit to several bits. The digital output signal of the quantizer 522 is outputted to the digital signal processor 60 as an output signal of the A/D converter 52, and also inputted to the current steering type D/A converter 524 as the digital feedback signal. The current steering type D/A converter 524 converts the digital feedback signal into the analog feedback current to output.

Here, the output terminal of the current steering type D/A converter 524 and the output terminal of the current output type frequency converter 51 are connected with each other, and therefore, many of the bias currents flowed out from the positive power supply terminal to the output terminal of the current steering type D/A converter 524 flow from the output terminal of the current output type frequency converter 51 to a negative power supply terminal (or the ground terminal) (shown by a dotted line arrow in FIG. 2). In other words, the bias current of the current steering type D/A converter 524 is reused as the bias current of the current output type frequency converter 51.

As stated above, according to the analog signal processor, the A/D converter of this embodiment, it is possible to perform the analog digital conversion with a necessary and sufficient resolution even when the input signal amplitude is small because the delta-sigma type A/D converter is used, and therefore, a variable gain amplification circuit of the communication device can be omitted. In addition, according to the analog signal processor, the A/D converter of this embodiment, it is possible to make the bias current in common, and to eliminate the power consumption because the current steering type D/A converter and the current output type frequency converter are included.

Figure 3:
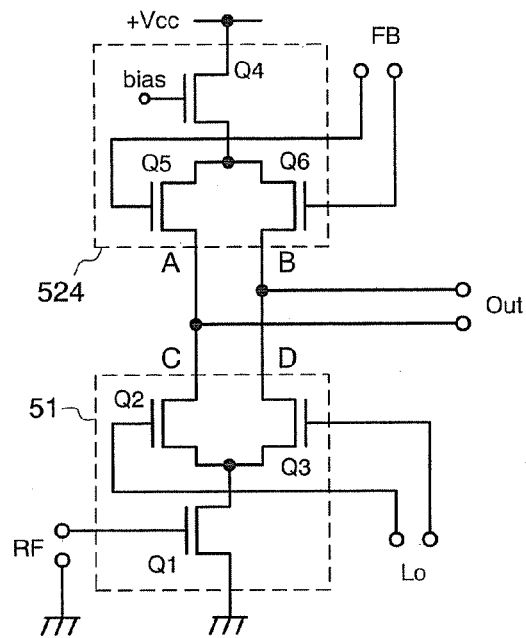
FIG. 3 is a circuit diagram showing a concrete example of a frequency converter and a current steering type D/A converter according to the receiving device of the first embodiment.

Here, the current steering type D/A converter 524 and the current output type frequency converter 51 in this embodiment are described in detail with reference to FIG. 3 and FIG. 4. As shown in FIG. 3, the frequency converter 51 of this embodiment includes an N-channel MOSFET transistor Q1 in which a gate is made to be a high-frequency input terminal "RF" and a source is connected to a ground, and similarly, transistors Q2 and Q3 in which respective sources are connected to a drain of the transistor Q1, and respective gates are made to be local signal input terminals "Lo". Drains of the transistors Q2 and Q3 output the frequency converted signals.

In addition, the current steering type D/A converter 524 of this embodiment includes a P-channel MOSFET transistor Q4 in which a gate is made to be a bias voltage terminal "bias", and a source is connected to a positive power supply "Vcc", and similarly, transistors Q5 and Q6 in which respective sources are connected to a drain of the transistor Q4, and respective gates are made to be feedback input terminals "FB". Drains of the transistors Q5 and Q6 output analog feedback currents.

The respective drains of the transistors Q2 and Q3 and the respective drains of the transistors Q5 and Q6 are connected with each other to thereby constitute an output terminal "Out" outputting a frequency converted signal. Namely, the frequency converter 51 is composed of an active type frequency conversion circuit in which the drains of the transistors Q2 and Q3 are made to be current outputs, and the current steering type D/A converter 524 is composed of a D/A conversion circuit of one bit in which the drains of the transistors Q5 and Q6 are made to be current outputs.

Both the frequency converter 51 and the current steering type D/A converter 524 shown in FIG. 3 are general circuits using the MOSFETs. When a high-frequency signal (received signal) is inputted to the terminal "RF", and a local signal is inputted to the terminal "Lo", the RF signal and the local signal are multiplied by nonlinear characteristics of the transistors Q1 to Q3, and a converted output (base band signal) is outputted to the terminal "Out". On the other hand, when a digital feedback signal is inputted to the terminal "FB", the digital feedback signal is converted into an analog feedback current to be outputted to the terminal "Out". Respective outputs of the frequency converter 51 and the current steering type D/A converter 524 are directly connected without being intervened by a capacitor and so on, and therefore, a signal converted into the base band signal and the feedback signal analog converted are combined (subtracted) to be outputted to the terminal "Out". This combined output is inputted to the current input type filter 521 shown in FIG. 2.

Here, when it is focused on the flow of the bias current from the power supply "Vcc" to the ground (the bias current of the frequency converter 51 and the current steering type D/A converter 524), the bias current steered at the terminal "bias" is inputted to the drains of the transistors Q2 and Q3 from the "Vcc" via the transistor Q4, and the transistors Q5 and Q6. Subsequently, the currents outputted from the sources of the transistors Q2 and Q3 are flowed into the ground via the transistor Q1. Namely, paths of the bias current of the current steering type D/A converter 524 and the frequency converter 51 are common, and it is constituted such that the frequency converter 51 reuses the bias current of the current steering type D/A converter 524. Accordingly, it becomes possible to suppress a current consumption compared to a case when bias circuits are provided respectively for the current steering type D/A converter 524 and the frequency converter 51.

In addition, in this embodiment, the output of the frequency converter 51 (the drains of the transistors Q2 and Q3) is directly connected to positions of "AB" points where a load of the current steering type D/A converter 524 is to be connected, the output of the current steering type D/A converter 524 (the drains of the transistors Q5 and Q6) is directly connected to positions of "CD" points where a load of the frequency converter 51 is to be connected, and therefore, it is in a mode in which both load resistances are omitted, and the number of components can be reduced.

As stated above, according to the analog signal processor, the A/D converter of this embodiment, plural circuit elements, namely, the bias current paths of the D/A converter and the frequency converter are made to be common, and therefore, the current consumption can be suppressed. And, outputs of the plural circuit elements are directly connected with each other, and therefore, the load resistances can be omitted, and the number of components can be suppressed.

Figure 4:
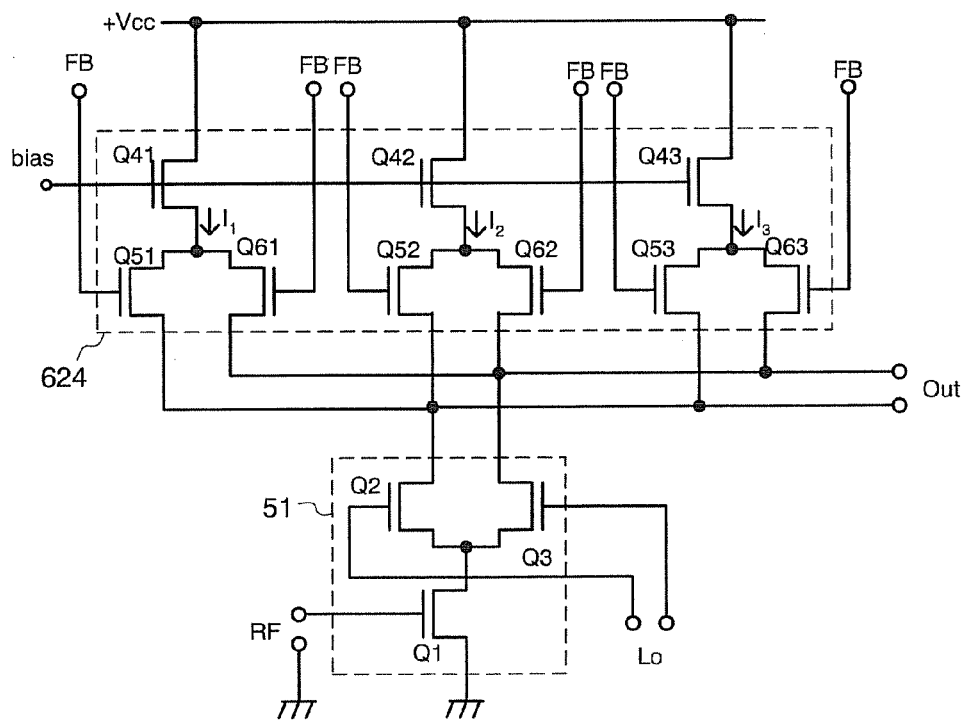
FIG. 4 is a circuit diagram showing another concrete example of a frequency converter and a current steering type D/A converter according to the receiving device of the first embodiment.

FIG. 4 shows a modified example of a frequency converter and a current steering type D/A converter of this embodiment. An example is shown in FIG. 4, in which a two-bit current steering type D/A converter 624 is included instead of the one-bit current steering type D/A converter 524 shown in FIG. 3.

The current steering type D/A converter 624 of this embodiment includes P-channel MOSFET transistors Q41 to Q43 in which gates are made to be a bias voltage terminal "bias", and sources are connected to a positive power supply "Vcc", and similarly, transistors Q51 to Q53 and Q61 to Q63 in which respective sources are connected to drains of the corresponding transistors Q41 to Q43, and gates are made to be feedback input terminals "FB". Namely, three D/A conversion circuits composed of three P-channel MOSFETs are connected in parallel.

Respective drains of the transistors Q2 and Q3, and respective drains of the transistors Q51 to Q53, and Q61 to Q63 are connected with each other to thereby constitute the output terminal "Out" outputting the frequency converted signal. The feedback signals inputted to a total of three pairs of feedback terminals (the respective gates of the transistors Q51 to Q53, and Q61 to Q63) are converted into the analog current signals having three current values.

In such a two or more bit D/A converter, it is possible to obtain an effect eliminating quantization noise compared to the case of the one-bit D/A converter. And, in the two or more bit D/A converter, the paths of the bias current of the current steering type D/A converter 624 and the frequency converter 51 can also be made in common as same as the example shown in FIG. 3, and therefore, the current consumption can be suppressed. In addition, the number of components can also be reduced.

Incidentally, here, an example in which the D/A converter is constituted by the PMOS, and the frequency conversion circuit is constituted by the NMOS is shown, but it is also possible to constitute the D/A conversion circuit by the NMOS, and the frequency conversion circuit by the PMOS. In this case, a direction of the bias current and a polarity of the transistor are reversed.

Here, a power consumption elimination effect, and a meaning obtained by making the bias paths of the frequency converter and the current steering type D/A converter constituting a digital feedback loop in common, in the analog signal processor, the A/D converter of this embodiment, are examined.

At present, most of the frequency conversion circuits used in a small-sized radio device such as a cellular phone are so-called the active type using an active element such as a transistor. When a passive type frequency conversion circuit is adopted, the passive type frequency conversion circuit in itself does not require the bias current, but a signal input buffer amplification circuit, a drive circuit for a local oscillation signal, an output buffer amplification circuit with low noise, and so on become necessary. Accordingly, when it is compared to an active type frequency conversion circuit such as a Gilbert multiplication circuit in which the frequency conversion circuit in itself has an amplification function, it is often the case that the power consumption of the passive type with including peripheral circuits becomes rather larger.

The active type frequency conversion circuit generally used, including the Gilbert multiplication circuit, is the current output type in which an output is obtained as a current. Consequently, when the A/D conversion circuit proposed in the above-stated document is compared to the analog signal processing circuit and the A/D conversion circuit according to the present embodiment, and the peripheral circuits are took into consideration in addition to the frequency conversion circuit, it is conceivable that the power consumption becomes smaller in the analog signal processing circuit, the A/D conversion circuit of the present embodiment in which the active multiplication circuit is used.

The same thing can be said to the D/A conversion circuit composing the feedback loop. Generally, so-called the current steering type in which an analog current value is controlled, is often used as a D/A conversion circuit with high-speed and high-accuracy. The power consumption of the D/A conversion circuit selecting a reference voltage by a switch such as the circuit proposed in the above-stated document becomes relatively small when it is focused only on the D/A conversion circuit, but a reference voltage generation circuit having low output impedance is necessary when it is used in actual, and therefore, the power consumption thereof becomes rather large when it is considered with including the peripheral circuits.

Consequently, an effect to suppress a total power consumption can be expected in the analog signal processing circuit, the A/D conversion circuit of the present embodiment adopting a system of the current output type, and the current steering type, when it is considered with including the peripheral circuits.

On the other hand, in the analog signal processing circuit, the A/D conversion circuit of this embodiment, the bias current of the D/A converter 524 composing the feedback loop is reused as the bias current of the frequency converter 51. The current steering type D/A converter 524 originally composing the feedback loop of the delta-sigma type A/D converter 52 operates to generate a signal denying the input signal of the current input type filter 521. Consequently, a drive capacity capable of outputting an equivalent current with the frequency converter 51 is required for the current steering type D/A converter 524. Accordingly, the bias current of the current steering type D/A converter 524 also requires the equivalent current with the bias current of the frequency converter 51, and therefore, the current consumption can be suppressed efficiently by making the bias current of both circuits in common.

In addition, it is possible to suppress a generation of noise for the extent of the noise generated in the load circuits compared to a case when the frequency converter 51 and the current steering type D/A converter 524 respectively include independent load circuits, because the load circuits can be omitted in the analog signal processing circuit, the A/D conversion circuit of the present embodiment. Generally, a large current is necessary to suppress the generation of internal noise, and therefore, it becomes possible to reduce the current consumption in the circuit with few noise generation points for that much.

Next, a receiving device of a second embodiment of the present invention is described in detail with reference to FIG. 5. The receiving device in this embodiment is the one in which the analog signal processor 50 of the first embodiment is replaced by an analog signal processor 150 shown in FIG. 5. Accordingly, the same reference numerals and symbols are used to designate the common elements, and the redundant description thereof will not be given.

Figure 5:
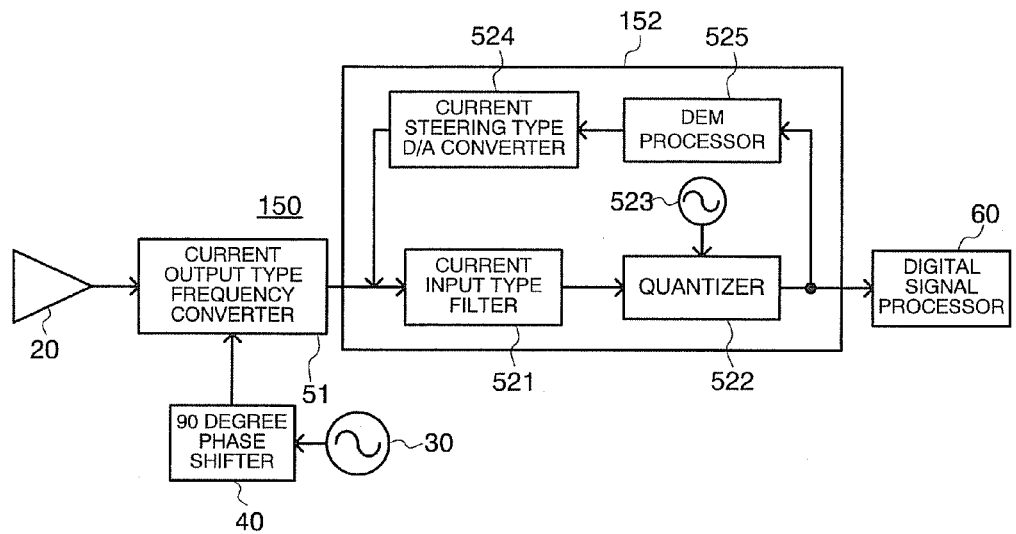
FIG. 5 is a block diagram showing a configuration of an analog signal processor according to a receiving device of a second embodiment.

As shown in FIG. 5, the analog signal processor 150 of this embodiment has the current output type frequency converter 51, and an A/D converter 152 composed of the current input type filter 521, the quantizer 522, the clock oscillator 523, the current steering type D/A converter 524, and a dynamic element matching unit (DEM processor) 525 diffusing a frequency component of noise. Incidentally, an analog signal processor to be paired has a common configuration with the analog signal processor 150, and therefore, the description thereof is not given. In the analog signal processor 150 of this embodiment, a point is different from the first embodiment that the DEM processor 525 is included at a front stage of the current steering type D/A converter 524 composing the digital feedback loop of the A/D converter 152.

The DEM processor 525 is a signal converter having a function to convert the digital feedback signal so that many noise components caused by an error of the current steering type D/A converter 524 may be distributed in an unnecessary signal band (a frequency band to be cut) of the current input type filter 521. When a digital base band signal quantized by the quantizer 522 is inputted, the DEM processor 525 performs the conversion process so as to get rid of the noise component into the cut band of the current input type filter 521, and inputs the signal to the current steering type D/A converter 524.

Subsequently, operations of the DEM processor 525 are described. Here, a case is explained as an example when the receiving device including the analog signal processor 150 shown in FIG. 5 is used, and the feedback signal is two bits (when the current steering type D/A converter 624 shown in FIG. 4 is used).

A feedback signal of the most basic delta-sigma type analog-digital conversion circuit is one bit, but there is a case when a signal of several bits is used to eliminate quantization noise. In such a case, the error of the current steering type D/A converter 624 is observed as the noise. The DEM processor 525 processes the feedback signal to distribute many of these noise components to out of the band.

In case of the current steering type D/A converter 624 in FIG. 4, output currents of a current source 1, a current source 2, and a current source 3 are set to be "$I_1$", "$I_2$", and "$I_3$", and an average value thereof is set to be "$I_0$", and then, they can be represented as follows: $I_1=I_0+\Delta I_1$; $I_2=I_0+\Delta I_2$; and $I_3=I_0+\Delta I_3$. Here, as it can be seen from a definition, $\Delta I_1+\Delta I_2+\Delta I_3=0$ (zero). When the DEM processor 525 is not used, only "$I_1$" is outputted from a positive terminal if thermometer codes (100) are continued to be inputted as a digital signal. At this time, an error "$\Delta I_1$" may be outputted constantly.

When the code (100) is continued to be inputted, the DEM processor 525 operates to output codes of (100), (010), and (001). Consequently, "$I_1$", "$I_2$", and "$I_3$" are sequentially selected as the current source at the current steering type D/A converter 624. As a result, the output of the average becomes to be "$I_0$". "$\Delta I_1$", "$\Delta I_2$", and "$\Delta I_3$" are sequentially outputted from the current steering type D/A converter 624 as the error, and then, the average thereof becomes to be "0" (zero). The frequency components such as "$\Delta I_1$", "$\Delta I_2$", and "$\Delta I_3$" outputted sequentially, can be removed at the current input type filter 521 as a quantized error component, and therefore, the delta-sigma type A/D converter 52 is enabled to convert only an object signal near a direct-current into a digital signal with high accuracy.

The DEM processor 525 can be realized by, for example, a Data weighted averaging (DWA) described in "A 19-Bit Low-Power Multibit Sigma-Delta ADC Based on Data Weighted Averaging" (IEEE Journal of Solid-State Circuits Vol. 32, No. 7, July, 1997) by Olivier Nys and others, and a Tree-structured Noise-Shaping Dynamic Element Matching (TNSDEM) shown in "A Third-Order—Modulator Using Second-Order Noise-Shaping Dynamic Element Matching" (IEEE Journal of Solid-State Circuits Vol. 33, No. 12, December, 1998) by Akira Yasuda and others. The entire contents of the above cited documents are incorporated herein by reference.

Next, a receiving device of a third embodiment of the present invention is described in detail with reference to FIG. 6. The receiving device in this embodiment is the one in which the analog signal processor 150 of the second embodiment is replaced by an analog signal processor 250 shown in FIG. 6. Therefore, the same reference numerals and symbols are used to designate the common elements, and the redundant description thereof will not be given.

Figure 6:
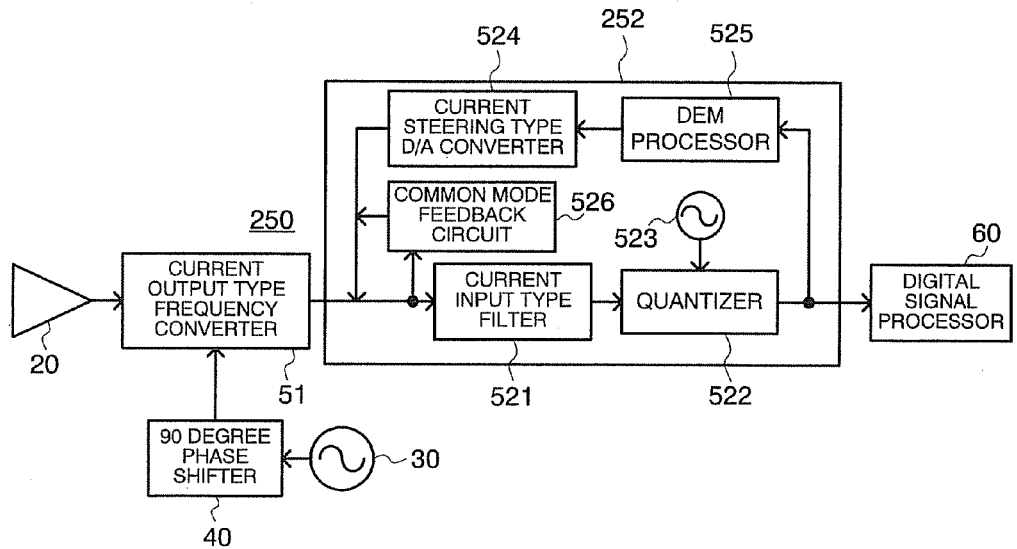
FIG. 6 is a block diagram showing a configuration of an analog signal processor according to a receiving device of a third embodiment.

As shown in FIG. 6, the analog signal processor 250 of this embodiment has the current output type frequency converter 51, and an A/D converter 252 composed of the current input type filter 521, the quantizer 522, the clock oscillator 523, the current steering type D/A converter 524, the DEM processor 525 diffusing the frequency component of noise, and a common mode feedback circuit 526 further performing a feedback of a common signal of a feedback signal. Incidentally, an analog signal processor to be paired has a common configuration with the analog signal processor 250, and therefore, the description thereof is not given. In the analog signal processor 250 of this embodiment, a point is different from the second embodiment that the common mode feedback circuit 526 is further included at the output of the current steering type D/A converter 524 of the digital feedback loop of the A/D converter.

The common mode feedback circuit 526 is a feedback circuit in which an input signal of the current input type filter 521 (a mixed signal of an output signal of the frequency converter 51 and an output signal of the current steering type D/A converter 524) is inputted, and a common mode component of the input signal is extracted to make a feedback to an output of the current steering type D/A converter 524 (the position between the output of the frequency converter 51 and the output of the current steering type D/A converter 524).

Output impedance of the current steering type D/A converter 524 and the current output type frequency converter 51 are respectively high. Consequently, when common mode input impedance of the current input type filter 521 is relatively low, a common mode voltage of the input of the current input type filter 521 may determine output terminal voltages of the current steering type D/A converter 524 and the current output type frequency converter 51. However, when an integration circuit is used as an input portion of the current input type filter 521, the common mode impedance in direct current becomes high, and therefore, a necessity arises to stabilize an electric potential. The common mode feedback circuit 526 is the feedback circuit having such an electric potential stabilization function.

Figure 7:
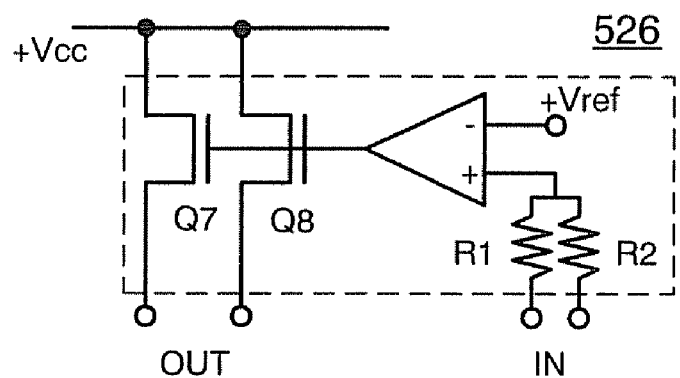
FIG. 7 is a circuit diagram showing a concrete example of a common mode feedback circuit according to the receiving device of the third embodiment.

FIG. 7 is a concrete circuit example of the common mode feedback circuit 526. The common mode feedback circuit 526 includes an operational amplifier "OP". One ends of resistances R1 and R2 are connected to a positive input of the operational amplifier "OP", and the respective other ends (IN) are connected to positive/negative terminals of the input of the current input type filter 521 respectively. A reference voltage power supply "$V_{ref}$" is connected to a negative input of the operational amplifier "OP".

Gates of P-channel type MOSFET transistors Q7 and Q8 are connected to an output of the operational amplifier "OP". Sources of the transistors Q7 and Q8 are connected to a positive power supply "Vcc", and similarly, drains thereof are respectively connected to an output (OUT) of the current steering type D/A converter 524.

The operational amplifier "OP" compares the inputted reference voltage "$V_{ref}$" and a common mode voltage detected by the resistances R1 and R2, and controls gate voltages of the PMOS transistors Q7 and Q8 functioning as the current sources according to the result thereof. As a result, it becomes possible to set the common mode voltage of the input of the current input type filter 521 to an approximate value with the reference voltage "$V_{ref}$", and to stabilize the input electric potential.

Incidentally, in the above-stated embodiment, it is described such that the common mode feedback circuit 526 is included in the second embodiment, but it is not limited to this. It may be constituted by including the common mode feedback circuit to the first embodiment.

As it is described above, according to the analog signal processing circuit, the A/D conversion circuit of the respective embodiments of the present invention, the variable gain amplification circuit of the communication device can be omitted because the delta-sigma type A/D converter having a wide dynamic range is used. And, the peripheral circuits such as the buffer amplification circuit to supply the high-frequency signal and the reference voltage become unnecessary because the current output type frequency converter and the current steering type D/A converter are used. Further, the bias current is used in common (reused) between the current output type frequency converter and the current steering type D/A converter, and therefore, the current consumption can be reduced. In addition, the current output type frequency converter and the current steering type D/A converter operate as the load circuit of the other circuit with each other, and therefore, the respective load circuits can be omitted, and the noise component generated at the load circuit can be made to be low noise.

It should be noted that the present invention is not limited to the above-described embodiments as they are, and in an implementation stage, it can be embodied by modifying components thereof within a range not departing from the spirit of the invention. Also, the plural components disclosed in the above-described embodiments can be appropriately combined to form various inventions. For example, some of all the components shown in the embodiments may be eliminated. Moreover, components from different embodiments may be combined appropriately.

It is described that the receiving device of the above-stated embodiments adopts a single conversion system in which a signal is converted into a base band signal by one time frequency conversion, but this also is not limited. A mode may be adopted in which an intermediate frequency is set to be converted into the base band signal by dividing into plural times.

According to the above-stated embodiments of the present invention, the power consumption with including the peripheral circuits can be eliminated.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A signal processing method, comprising:
   frequency converting an analog input signal into an analog current signal, at a frequency converter;
   removing a noise component from the analog current signal to output an analog voltage signal, at a filter;
   quantizing the analog voltage signal to generate a digital output signal, at a quantizer;
   converting the digital output signal into an analog feedback current to feedback to an input of the filter, at a D/A converter; and
   supplying a bias current for the D/A converter to an output of the frequency converter via a path of the analog current signal as a bias current driving the frequency converter.

2. The signal processing method according to claim 1, wherein the bias current of the D/A converter flows from a positive power supply terminal of the D/A converter to a negative power supply terminal of the frequency converter via an output terminal of the D/A converter and an output terminal of the frequency converter.

3. The signal processing method according to claim 1, further comprising:
   converting the digital output signal to make a noise component caused by an error of the D/A converter distributed at an attenuation region of the filter; and
   inputting the converted digital output signal to the D/A converter.

4. The signal processing method according to claim 1, further comprising:
   detecting a common mode component of output voltages of the D/A converter and the frequency converter, and
   controlling the bias current thereof to make the common mode component become a predetermined voltage.

5. The signal processing method according to claim 1, wherein the D/A converter includes a pair of first MOSFETs in which gates thereof are connected to an output of the quantizer and drains thereof are connected to the input of the filter, and a second MOSFET in which a drain thereof is connected to sources of the first MOSFETs and a source thereof is connected to a first reference potential, and
   wherein the frequency converter includes:
      a third MOSFET in which a source thereof is connected to a second reference potential different from the first reference potential, and the analog input signal is inputted to a gate thereof; and
      a pair of fourth MOSFETs in which sources thereof are connected to a drain of the third MOSFET, a signal to perform the frequency conversion is inputted to gates thereof, and drains thereof are connected to the input of the filter.

6. The signal processing method according to claim 1, wherein the digital output signal is a signal with the number of bits of two or more.

7. A signal processing method, comprising:
frequency converting an analog input signal to output an analog current signal, at a frequency converter;
removing a noise component form the analog current signal to output an analog voltage signal, at a filter;
quantizing the analog voltage signal outputted from the filter to generate a digital output signal, at a quantizer; and
converting the digital output signal into an analog feedback current to feedback to an input of the filter, at a D/A converter,
wherein the frequency converter is driven by reusing a bias current of the D/A converter.

8. The signal processing method according to claim 7,
wherein the bias current of the D/A converter flows from a positive power supply terminal of the D/A converter to a negative power supply terminal of the frequency converter via an output terminal of the D/A converter and an output terminal of the frequency converter.

9. The signal processing method according to claim 7, further comprising:
converting the digital output signal to make the noise component caused by an error of the D/A converter distributed at an attenuation region of the filter, and
inputting the converted digital output signal to the D/A converter.

10. The signal processing method according to claim 7, further comprising:
detecting a common mode component of output voltages of the D/A converter and the frequency converter, and
controlling the bias current thereof to make the common mode component become a predetermined voltage.

11. The signal processing method according to claim 7,
wherein said D/A converter includes a pair of first MOSFETs in which gates thereof are connected to an output of the quantizer and drains thereof are connected to the input of the filter, and a second MOSFET in which a drain thereof is connected to sources of the first MOSFETs and a source thereof is connected to a first reference potential, and
wherein the frequency converter includes:
a third MOSFET in which a source thereof is connected to a second reference potential different from the first reference potential, and the analog input signal is inputted to a gate thereof; and
a pair of fourth MOSFETs in which sources thereof are connected to a drain of the third MOSFET, a signal to perform the frequency conversion is inputted to gates thereof, and drains thereof are connected to the input of the filter.

12. The signal processing method according to claim 7,
wherein the digital output signal is a signal with the number of bits of two or more.

* * * * *